United States Patent [19]

Hart

[11] Patent Number: 5,494,168

[45] Date of Patent: Feb. 27, 1996

[54] SURFACE MOUNT COMPONENT DISPENSING SYSTEM

[75] Inventor: Martin B. Hart, Seal Beach, Calif.

[73] Assignee: National Electronics Corp., Garden Grove, Calif.

[21] Appl. No.: 241,791

[22] Filed: May 12, 1994

[51] Int. Cl.⁶ .................................................. B65D 73/02
[52] U.S. Cl. .................... 206/714; 206/395; 206/409; 206/416; 242/611.2; 242/587.2; 242/613.4
[58] Field of Search ...................... 206/328, 330, 206/395, 396, 403, 409, 411, 413, 414, 415, 416, 714; 242/611.2, 587.2, 613.4

[56] References Cited

U.S. PATENT DOCUMENTS

| | | | |
|---|---|---|---|
| 2,796,170 | 6/1957 | Davis | 206/409 X |
| 3,149,719 | 9/1964 | Thompson et al. | 206/395 |
| 3,166,187 | 1/1965 | Araujo | 206/409 X |
| 3,964,606 | 6/1976 | Hogg et al. | 206/395 |
| 4,108,305 | 8/1978 | Komatu | 206/330 |
| 4,616,469 | 10/1986 | Skalleberg | 206/395 X |

OTHER PUBLICATIONS

Specification sheet by Advantek, Inc., entitled "Advantek's New Twist to Lokreel Packaging Reels".
Specification sheet by PRC of America, entitled "Anti Static Reels for Surface Mounted Devices (SMD'S)".

*Primary Examiner*—Jacob K. Ackun
*Attorney, Agent, or Firm*—Knobbe, Martens, Olson & Bear

[57] ABSTRACT

An improved surface mount component dispensing system including a dispenser and a package/display box. The dispenser is formed as a spool having an outer diameter of about four inches so that a small amount of tape carrying quantities of surface mounted components can be packaged. The package/display box includes a circular front window sized to expose an information label on the dispenser in any rotational orientation of the dispenser. The box further includes a punch-out manual assembly dispensing slot in one end wall.

10 Claims, 3 Drawing Sheets

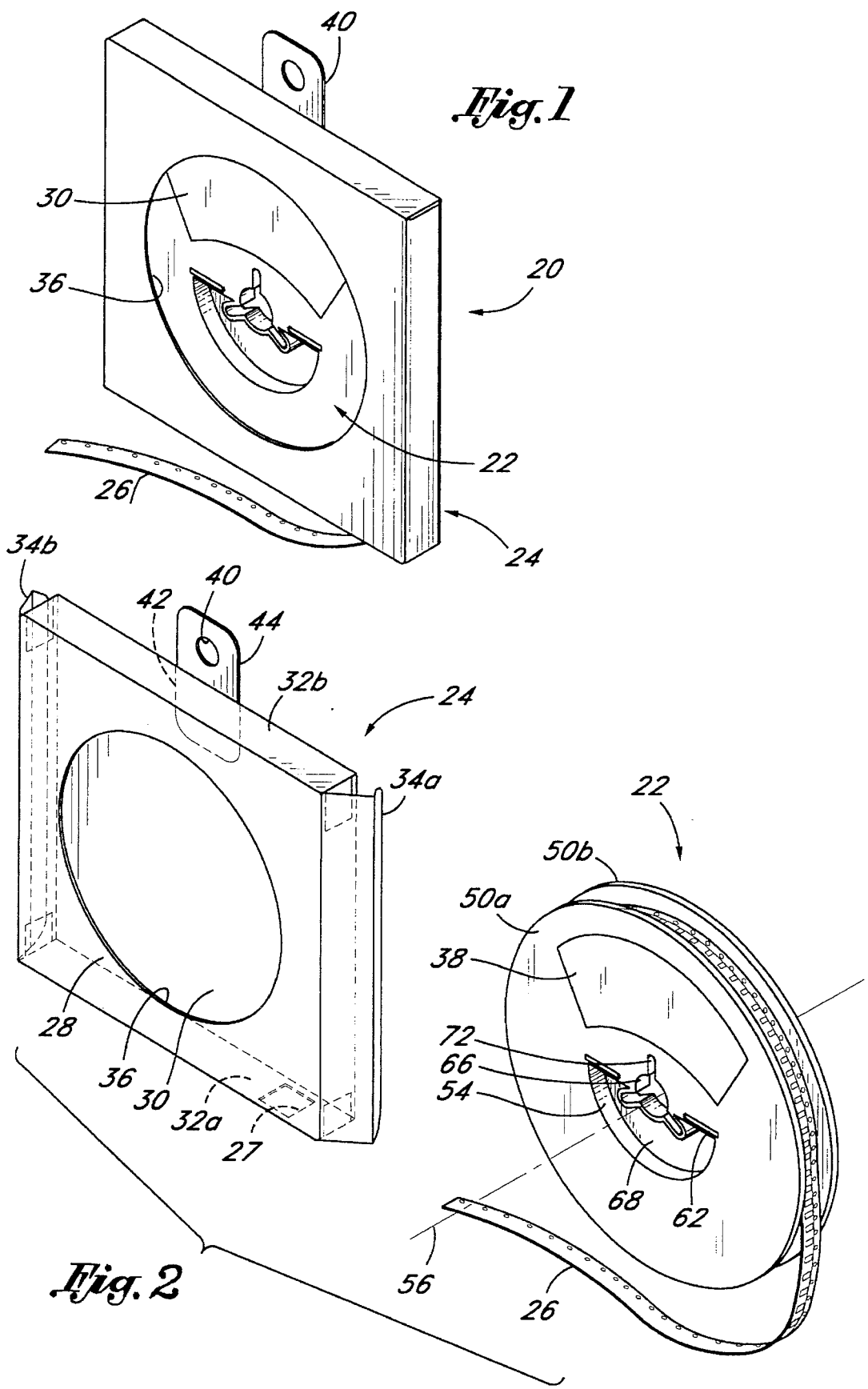

SURFACE MOUNT COMPONENT DISPENSING SYSTEM

FIELD OF THE INVENTION

The present invention relates to a dispensing system for electronic surface mount components, and more particularly, to an improved carrier tape dispenser and storage box.

BACKGROUND OF THE INVENTION

Electronic surface mount components for circuit boards are becoming smaller and smaller. Some of the smallest components are only one millimeter in length by one-half millimeter in width. Commonly, for mass production of circuit boards utilizing such tiny electronic components, a continuous carrier tape is utilized. The tape is fed into an automatic pick and place machine for assembling the components onto the appropriate location on a circuit board. The electronic components are held within receptacles formed in the tape and the tape has indexed drive holes running parallel to the components for the assembly machine feed mechanism. One type of plastic tape has small recesses or pockets for the components, the open mouth of the pockets being covered over with a thin strip of flexible adhesive tape which is removed as the components are accessed. In another version, a paper tape has small cutouts along its length and strips of adhesive tape on either side hold the components within the cutouts. A length of leader tape is provided absent of components for initially feeding the tape into the assembly machine without wasting components. The leader extends between 9 and 14 inches in length, or otherwise conforms to Electronic Industry Assoc. standards.

Conventional tape dispensers consists of plastic spools around which the tape is wound. These spools are typically provided in either 7-inch or 13-inch diameters and can hold between 3,000 and 10,000 of the electronic components within each spool, depending on the component. Some of the components packaged on carrier tapes loaded onto spools include resistors, capacitors, inductors, diodes, transistors, etc. Although many customers prefer bulk packaging with multiple thousands of electronic components, other customers desire a smaller quantity and can either buy the large capacity dispensers or must request the supplier to cut off a shorter length of tape from an off-the-shelf spool. The supplier is faced with a dilemma: The customer may go elsewhere if the request to cut off a smaller length of tape is refused, however, cutting the tape leaves a "broken" and undesirable dispenser having an odd number of components and no leader tape. The broken dispenser typically languishes on the supplier's shelves as customers do not want to buy tape having no leader and in odd component quantities. The broken dispenser also may tend to unwind and become tangled with adjacent items. Further, the cost of preparing a new leader length is often more than the value of the components in the tape. What is worse, the supplier cannot return the dispenser to the manufacturer as the product is damaged. Ultimately, the supplier may be forced to write off the damaged inventory.

Accordingly, there is a need for a system for dispensing surface mount components capable of holding smaller quantities than was previously available.

SUMMARY OF THE INVENTION

The present invention solves a problem with prior surface mount component dispensers by providing a dispenser with a reduced component storage capacity. The small article carrier tape dispenser of the present invention generally comprises a pair of parallel circular side walls connected by a cylindrical wall, the side walls being spaced slightly greater than the width of the carrier tape being stored. The cylindrical connecting wall is concentrically located at a radial distance about the central axis of the circular side walls. A drive hub including radially directed drive fingers or slots spaced equidistant about the circumference of the hub is provided to receive a drive sprocket of an assembly machine. The dispenser includes at least two connecting portions between the cylindrical wall and the drive hub for centering and supporting the hub in the dispenser. A pair of tape receiving slots are formed by the connecting portions extending from an outer surface of the cylindrical wall into close proximity with the drive fingers. The pair of tape receiving slots are diametrically opposed across the hub and circumferentially oriented with respect to the hub an equal distance from one of the drive fingers. The circular side walls preferably have a diameter of about 4 inches or less.

In a preferred aspect of the present invention, a surface mount component dispensing system is provided which includes a tape dispenser and a package/display box. The tape dispenser is preferably a spool having an outer diameter of about 4 inches or less. The spool includes a pair of parallel circular side walls joined at a cylindrical tape support wall which spaces the side walls slightly greater than the width of the surface mount component carrier tape. A central cylindrical drive hub having outwardly directed drive fingers is connected to the cylindrical tape support wall by at least two connecting portions. A majority of the outer surface of one-half of one of the circular side walls is adapted to display information pertaining to the components held on the carrier tape. The dispenser package/display box has a circular aperture in one side sized to expose the information displayed on the circular side wall in any rotational orientation of the dispenser within the box.

The preferred dispenser box is of a cardboard construction folded into the box shape and having end flaps and closure tabs. In addition to the circular aperture in one side wall, the preferred box includes a punch out tab in one of the end walls not having the closure flaps for dispensing carrier tape manually. More particularly, the punch out is located close to a corner of one of the end walls so that the carrier tape may be dispensed straight off the outer circumference of the spool without bending.

BRIEF DESCRIPTION OF THE DRAWINGS

FIG. 1 is a front perspective view of the surface mount component dispensing system of the present invention;

FIG. 2 is a perspective exploded view of the system of FIG. 1;

DESCRIPTION OF THE PREFERRED EMBODIMENTS

Figure 3:
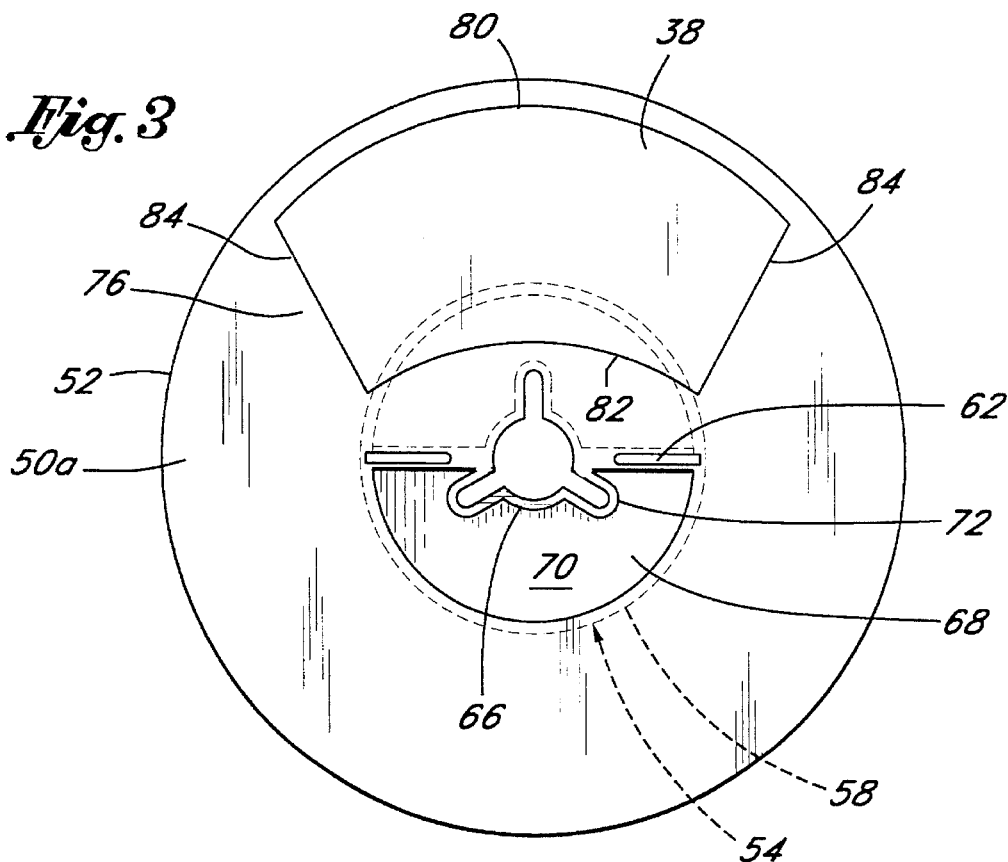
FIG. 3 is a front elevational view of a dispenser of the present invention.

With reference to FIGS. 1 and 2, a carrier tape dispensing system 20 generally comprises a spool-type dispenser 22 within a package/display box 24. The dispenser 22 preferably has an outside diameter of 4 inches or less, and the surrounding box 24 is approximately 4 inches on each side. The dispenser 22 is sized to hold a length of carrier tape 26 wrapped around a central portion. The carrier tape is of a conventional kind as is described below with reference to FIGS. 5 and 6, and contains a plurality of electronic components in receptacles along its length. The dispenser 22 may be removed from the box 24 and inserted into a delivery system of an automatic circuit board assembly machine, or the tape 26 may be manually removed from the dispenser 22 through a dispensing aperture 27 in one end wall of the box 24.

In previous spool-type dispensers, the diameter was such that the capacity was suitable for large production runs only. More particularly, a 7-inch spool has a capacity of 4000 capacitors or 5000 resistors, with the 13-inch spool holding even more. In contrast, the present smaller sized dispenser 22 can hold 500 capacitors or 1000 resistors, and still be used in conjunction with an automated pick and place assembly machine.

With reference to FIG. 2, the box 24 generally comprises a front panel 28, a rear panel 30, a pair of end walls or panels 32a, 32b and a pair of end flaps 34a, 34b. The end panels 32a, 32b are either integrally formed with or glued to the front and rear panels 28, 30, while the end flaps 34a, 34b are simply folded in to close the box. A central circular display window 36 is formed in the front panel 28 to enable visual inspection of the dispenser 22 therein. The size of the display window 36, and the positioning of an information label 38 on the dispenser 22 ensures that the information can be viewed from any orientation of the dispenser within the box.

The aperture 27 is formed after punching out a small tab (not shown) defined by rectangular score lines in the end panel 32a. The aperture 27 is positioned close to the corner of the panel 32a and the end flap 34a and is thus optimally positioned to dispense tape 26 tangentially off the dispenser 22 along a line generally parallel to the end flap 34a. Plastic tape 26, shown in FIG. 5, includes receptacles molded in one side which faces the exterior of the coil of tape when in the dispenser 22. The protruding receptacles thus tend to catch on one edge of the aperture 27 and help prevent an extending portion of the tape 26 from retracting back into the box 22.

One major advantage of the present system 20 is the elimination of yards of loose carrier tape from unconfined spool-type dispensers. The containment function of the box 24 maintains the tape 26 wound on the dispenser 22 until needed. If the dispenser 22 is simply installed in an automatic assembler, there is relatively little problem with the tape unwinding. However, in the past, if the dispenser was removed from the assembly machine for whatever reason, the tape tended to uncoil when the dispenser was put down. Also, many small jobs involve manually removing the electronic components from the tape, which previously led to the same problem of uncoiling. The provision of the box 24 allows the operator to confine the tape 26 in the dispenser 22 between automatic assembler uses. Perhaps most convenient, however, the dispenser 22 can remain in the box 24 for small jobs as small lengths of the tape 26 are pulled from the dispensing aperture 27 as needed.

As seen in FIG. 2, a hinged flap 40 is formed in an upper portion of the rear panel 30. The flap 40 is hinged about the corner between the rear panel 30 and one of the end panels 32b. The flap 40 is preferably formed by making a rectangular score line 42 in the rear panel 30 so that the flap 40 is initially formed as part of the rear panel and may be punched out to pivot about the aforementioned corner. The flap 40 includes a peg receiving aperture 44 for insertion of a peg on a display rack. The system 20 can thus easily be hung on the display rack of a retailer via the hinged flap 40.

Figure 4:
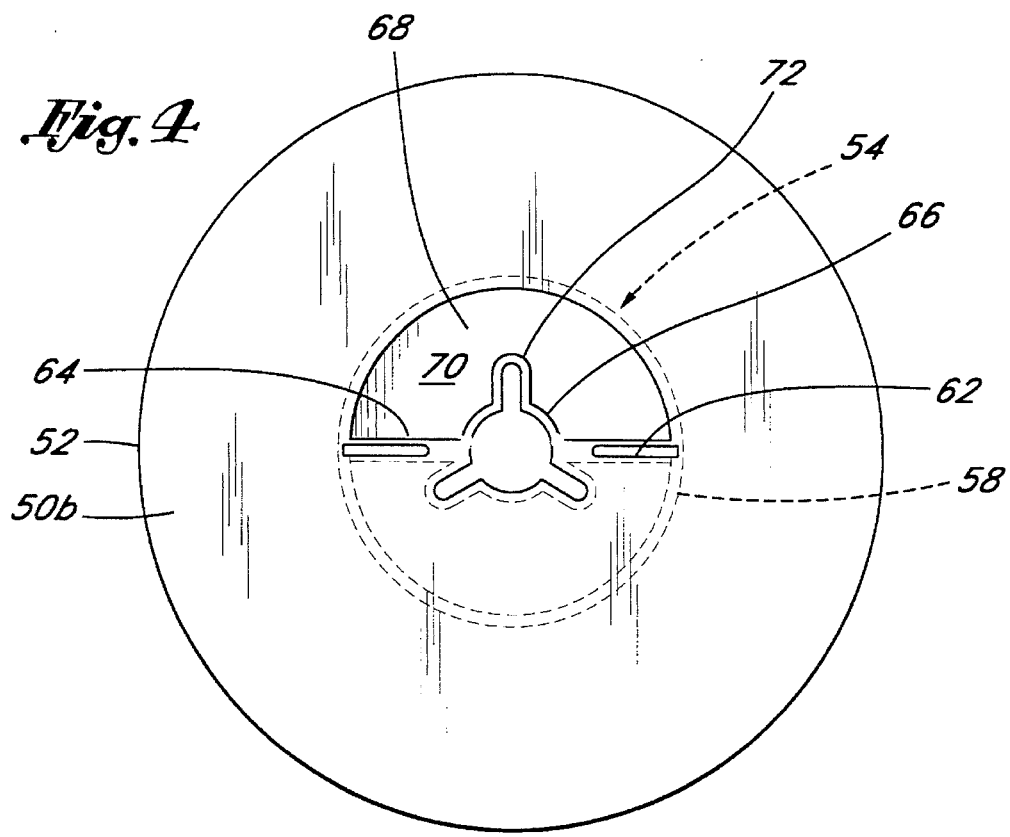
FIG. 4 is a rear elevational view of the dispenser.

Referring to FIGS. 2–4, the dispenser 22 comprises a pair of opposed circular end or side walls 50a, 50b oriented parallel to one another and spaced the approximate width of the particular carrier tape 26 stored therein. Typical tape widths are 8 mm or 12 mm, but others may be suitably stored in the dispenser 22. The side walls 50 each have a perimeter edge 52 whose diameter is 4 inches or less. A cylindrical connecting wall 54 is formed between the side walls 50a, 50b and lies parallel to a common axis 56 of the side walls. The wall 54 defines a radial tape support surface 58 around which the tape 26 is wound. The tape support surface 58 is discontinuous at two locations diametrically opposed about the cylindrical wall 54. At these locations, apertures lead to tape receiving slots 62 extending from the tape support surface 58 radially inward toward the axis 56. A first end of the tape 26 inserts into one of the tape receiving slots 62 to hold the first end therein while the tape is being wound around the tape support surface 58. This is a conventional method of winding flexible strips around spools or reels.

The tape receiving slots 62 are formed within a pair of connecting portions 64 between the cylindrical wall 54 and a central generally cylindrical drive hub 66. The connecting portions 64 are defined by the generally radially directed walls of the tape receiving slot 62. The exterior side of the connecting portions 64 form flat end walls of semi-cylindrical cavities 68 defined within the confines of the cylindrical wall 54. There is one cavity 68 open to each side of the dispenser 22. In this respect, an inner region of each circular sidewall 50 forms a floor 70 of one of the cavities 68, and the cavities have a depth approximately equal to the spacing between side walls 50a,b. The surface of the floor 70 of each cavity 68 may be embossed with product information or other specifications of the dispenser 22 or carrier tape 26.

The drive hub 66 generally comprises a cylindrical wall extending into each of the opposed semi-cylindrical cavities 68. The drive hub 66 further includes three radially outwardly extending drive fingers 72 circumferentially spaced equally around the axis 56. Thus, the drive fingers 72 are disposed approximately 120 degrees around the circumference of the drive hub 66. The drive hub 66 is of a standard size with a diameter of approximately 13 mm. Likewise, standard drive fingers 72 extend radially outward from the cylindrical hub 66 a further 2.5 mm, for a total radial reach of approximately 9 mm from the axis 56.

The present invention includes a novel arrangement of tape receiving slots 62 relative to the drive fingers 72. A preferred cylindrical connecting wall 54 diameter is approximately 52 mm, or a 26 mm radius. The tape receiving slots 62 have a standard length of approximately 15 mm. The reduced cylindrical connecting wall 54 diameter creates an interference between the inner ends of the tape receiving slots 62 and the outwardly extending drive fingers 72. The slots 62 thus cannot be positioned in circumferential alignment with any of the fingers 72. Said another way, if one of the tape receiving slots 62 were aligned with one of the drive fingers 72, the wall therebetween would be thinner than that required by standards.

Consequently, the diametrically opposed tape receiving slots 62 are oriented circumferentially about the drive finger 72 to be equidistant from at least one of the fingers, as shown in the drawing. To illustrate, if the three fingers 72 are arbitrarily positioned at 0°, 120° and 240° about the axis 56, the slots 62 may be positioned at 90° and 270°, both 90° from the first finger. This arrangement was not previously preferred as the diameter of the cylindrical wall in 7 inch or 13 inch spools was great enough to separate the terminal end of each of the tape receiving slots from the outwardly extending drive finger, and the relative orientation was chosen otherwise.

As seen in FIG. 3, a large circular segment or region 76 of one of the side walls 50 is provided to imprint display information. More preferably, a display label 38 is adhered to the region 76. The display label 38 is preferably formed with an outer curvilinear border 80, an inner curvilinear border 82 and a pair of side borders 84. The outer border 80 is formed along a circle centered about the central axis 56, and thus lies adjacent to the edge of the display window 36. The inner border 82 is formed along a circle centered about a point offset from the axis 56. Preferably, the radius of curvature of each of the inner and outer borders 80, 82 are equal. The side borders 84 extend along diverging lines which intersect at the center of curvature of the inner border 82 and preferably form an angle of approximately 60°.

The arrangement of the outline of the label 38 maximizes the space available and provides a aesthetically pleasing display. Advantageously, the label 38 can be read through the display window 36 at any rotational orientation of the dispenser 22. Furthermore, the dispenser can be rotated within the box 24 to orient the label 38 and information thereon upright with respect to the upper pegboard flap 40, for example.

In a preferred embodiment, the dispenser 22 is injection molded as a single piece of polyethylene. In other embodiments, the dispenser 22 may comprise multiple pieces, or be manufactured with other materials.

Figure 5:
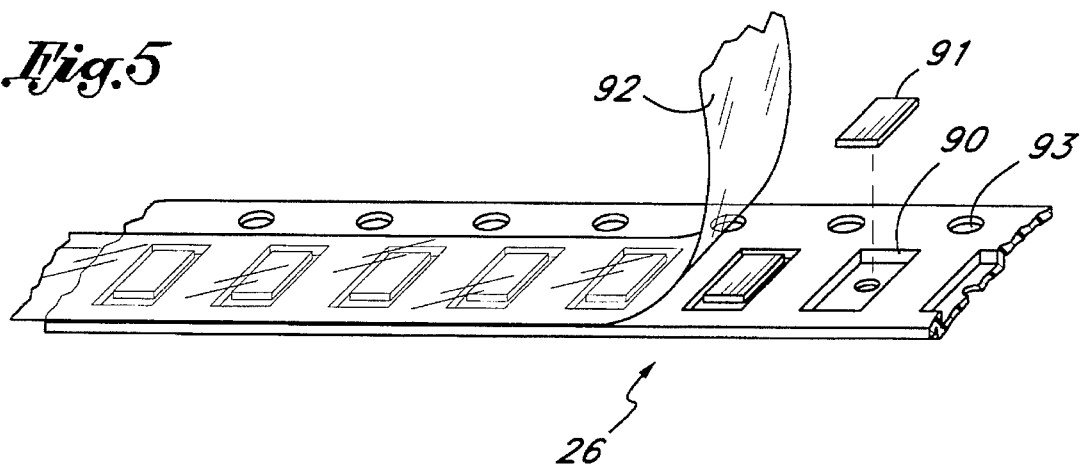
FIG. 5 is a detailed perspective view of one type of carrier tape utilized in the present invention.

With reference to FIG. 5, one form of tape is formed of molded plastic having receptacles 90 sized to receive the surface mount components 91. Components are held within the receptacles 90 by the application of a continuous band or strip of adhesive tape 92, to be removed when accessing the components. A row of feed holes 93 runs parallel to the receptacles 90 for an assembly machine to index the tape 26.

Figure 6:
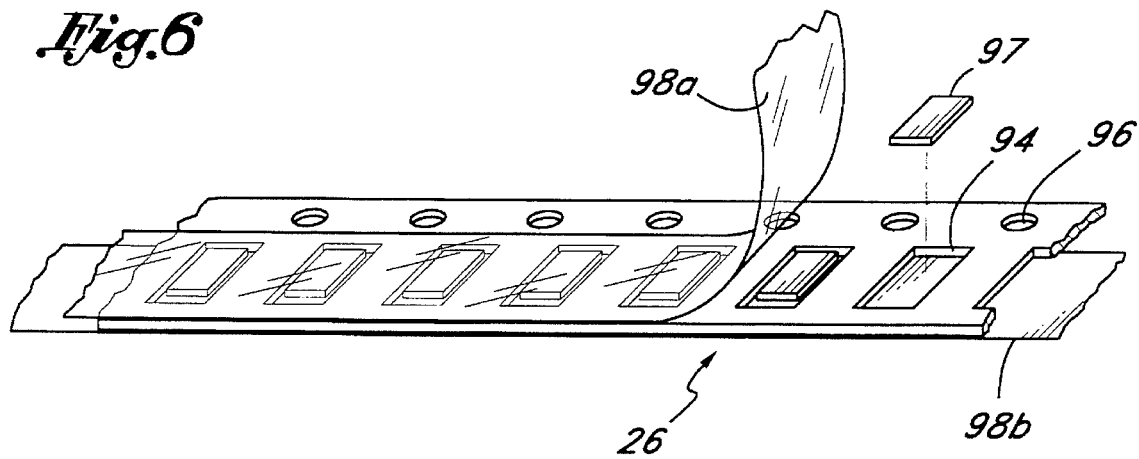
FIG. 6 is a detailed perspective view of a second type of carrier tape used in the present system.

In another form, the tape 26 is formed of paper or other material in the shape seen in FIG. 6. Cutouts 94 are formed in the tape 26 at spaced intervals and a row of feed holes 96 parallel the cutouts. Components 97 are positioned within the cutouts 94 and held therewithin by two strips of adhesive tape 98a, 98b, one on either side of the tape 26.

Surface mount components are often divided into in small lots of 100 or so and stored loosely in bags for manual assembly. In another advantageous feature of the present system, the bags of smaller lots of components can be packaged in the package/display box 24 with the contents being visible through the display window 36. The bags are preferably 4 inches square, slightly smaller than the inner confines of the box 24 but larger than the window 36.

Although this invention has been described in terms of certain preferred embodiments, other embodiments that are apparent to those of ordinary skill in the art are also within the scope of the invention. Accordingly, the scope of the invention is intended to be defined only by reference to the appended claims.

What is claimed is:

1. A surface mount component carrier tape dispenser, comprising:

a pair of circular side walls spaced slightly greater than a width of the carrier tape and having a diameter of about four inches;

a central cylindrical drive hub including three radially outwardly directed drive fingers circumferentially spaced about said hub;

a cylindrical wall connecting said side walls at a location between said drive fingers and a perimeter of said side walls;

at least two connecting portions between said cylindrical wall and said drive hub for centering and supporting said hub at the center of said cylindrical wall;

a pair of tape receiving slots extending from an outer surface of said cylindrical wall radially inward to a location proximate said hub, said radially inwardly directed slots diametrically opposed across said hub and circumferentially spaced around said hub an equal distance from one of said fingers.

2. The dispenser of claim 1, wherein said sidewalls are approximately 100 mm in diameter and said cylindrical wall is approximately 52 mm in diameter.

3. A system for dispensing surface mount components on carrier tape, comprising:

a dispenser on which tape is coiled, including a pair of circular side walls spaced slightly greater than a width of the carrier tape and having a diameter of about 4 inches, and printed information on an outer face of one of said circular side walls said information being positioned within an outer circle concentric with a perimeter of said circular side wall;

a central cylindrical drive hub including three radially outwardly directed drive fingers circumferentially spaced about said hub;

a cylindrical wall connecting said side wall at a location between said drive fingers and a perimeter of said side walls;

at least two connecting portions between said cylindrical wall and said drive hub for centering and supporting said hub at the center of said cylindrical wall;

a pair of tape receiving slots extending from an outer surface of said cylindrical wall radially inward to a location proximate said hub, said radially inwardly directed slots diametrically opposed across said hub and circumferentially spaced around said hub an equal distance from one of said fingers; and a package/display box sized to receive said dispenser and having a display window defining an opening in one panel adjacent said dispenser face, said window surrounding said outer circle so that the information is visible through said opening regardless of the rotational orientation of the dispenser within the box.

4. The system of claim 3, wherein said dispenser is a generally flat spool and said box includes an aperture in one end panel for manually dispensing the tape from the dispenser within the box.

5. The system of claim 3, wherein said box comprises:

a front panel;

a rear panel parallel to and spaced from said front panel;

a pair of end walls lying parallel to each other and joining adjacent edges of said panels; and a pair of end flaps each connected to a free edge of one of said front panel or said rear panel and adapted to hinge about said edge and close said box, wherein said front panel includes the circular display window which reveals a majority of the dispenser within.

6. The system of claim 5, wherein one of said end panels of said box includes an aperture for manually dispensing the tape from the dispenser in the box.

7. A system for dispensing surface mount components, comprising:

a carrier tape defining receptacles spaced along the tape, said receptacles holding surface mount components therein, one surface mount component per receptacle;

a spool dispenser for said tape;

a package/display box sized to receive said dispenser in a manner to permit the dispenser to rotate in the box, said box comprising a front panel, a rear panel parallel to and spaced from said front panel, and a plurality of end walls joining adjacent edges of said panels to close said box, said front panel including a large, centrally located circular display window which reveals a majority of an end wall of the dispenser within; and an aperture in one end wall of said box for manually dispensing the tape from the dispenser within the box, said aperture formed proximate a corner between two end walls spaced from said corner to form an edge directed away from said corner.

8. A method of packaging surface mount component carrier tape, said carrier tape defining receptacles spaced along the tape, said receptacles holding surface mount components therein, one surface mount component per receptacle, said carrier tape being coiled on a spool dispenser having a pair of spaced circular end walls joined by a hub, said receptacles on said coiled tape facing radially outward, said method comprising the steps of:

positioning said spool dispenser in a package/display box sized to receive said dispenser in a manner to permit the dispenser to rotate in the box, said box comprising a front panel, a rear panel parallel to and spaced from said front panel, and a plurality of end walls joining adjacent edges of said panels to close said box;

forming a small aperture in one end wall of said box for manually dispensing the tape from the dispenser within the box, said aperture formed proximate a corner between two end walls and spaced from said corner to form an edge directed away from said corner to interfere with said radially outwardly facing receptacles on said carrier tape; and dispensing a length of said tape from the dispenser within the box by way of said aperture.

9. The method of claim 8, wherein said step of forming comprises punching out a small portion of said end wall, said portion defined by score lines preformed in said box.

10. The method of packaging surface mount component carrier tape as in claim 8, comprising:

applying to one of said dispenser end walls indicia regarding the components of said tape, said indicia positioned with an outer circle concentric with a perimeter of said one end wall; and after positioning said spool in said display box rotating the spool in the box to permit said indicia to be seen through a central opening in a side panel of said box in any rotational orientation of the dispenser, said opening defined by a window larger than said outer circle.

* * * * *